US008277564B2

(12) United States Patent
Le et al.

(10) Patent No.: US 8,277,564 B2
(45) Date of Patent: Oct. 2, 2012

(54) METHOD FOR REMOVING A HARDENED PHOTORESIST

(75) Inventors: Quoc Toan Le, Belgrade (BE); Els Kesters, Holsbeek (BE); Guy Vereecke, Chastre (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/561,661

(22) Filed: Sep. 17, 2009

(65) Prior Publication Data

US 2010/0071718 A1 Mar. 25, 2010

Related U.S. Application Data

(60) Provisional application No. 61/098,474, filed on Sep. 19, 2008.

(51) Int. Cl.
*C23G 1/00* (2006.01)

(52) U.S. Cl. ........... 134/1.2; 134/1; 134/1.1; 134/1.3; 134/2; 134/4; 134/21; 134/25.4; 134/26; 134/27; 134/30; 134/31; 134/34; 134/36; 134/37; 134/42; 134/902

(58) Field of Classification Search ........... 134/1, 1.1, 134/1.2, 1.3, 2, 4, 21, 25.4, 26, 27, 30, 31, 134/34, 36, 37, 42, 902
See application file for complete search history.

(56) References Cited

U.S. PATENT DOCUMENTS

| | | | |
|---|---|---|---|
| 4,749,436 A * | 6/1988 | Minato et al. | 156/345.1 |
| 5,783,459 A * | 7/1998 | Suzuki et al. | 438/612 |
| 6,127,279 A * | 10/2000 | Konuma | 438/745 |
| 6,358,676 B1 * | 3/2002 | Wu | 430/329 |
| 6,616,773 B1 * | 9/2003 | Kuzumoto et al. | 134/26 |
| 2003/0008459 A1 * | 1/2003 | Yuzuriha et al. | 438/264 |
| 2003/0215751 A1 * | 11/2003 | Otake et al. | 430/311 |
| 2004/0202969 A1 * | 10/2004 | Park et al. | 430/331 |
| 2005/0241673 A1 * | 11/2005 | Endo et al. | 134/1.3 |
| 2005/0245082 A1 * | 11/2005 | Perng et al. | 438/687 |
| 2005/0279380 A1 * | 12/2005 | Elliott et al. | 134/1.1 |
| 2007/0012336 A1 * | 1/2007 | Su et al. | 134/1 |
| 2007/0020943 A1 * | 1/2007 | Kim et al. | 438/725 |
| 2007/0072095 A1 * | 3/2007 | Ko et al. | 430/5 |
| 2007/0178404 A1 * | 8/2007 | Brodsky et al. | 430/270.1 |
| 2007/0181165 A1 * | 8/2007 | Verhaverbeke | 134/40 |
| 2007/0254476 A1 * | 11/2007 | Chou et al. | 438/643 |
| 2010/0071718 A1 * | 3/2010 | Le et al. | 134/1 |

* cited by examiner

*Primary Examiner* — Bibi Carrillo
(74) *Attorney, Agent, or Firm* — McDonnell Boehnen Hulbert & Berghoff LLP

(57) ABSTRACT

A method for removing a hardened photoresist from a semiconductor substrate. An example method for removing a hardened photoresist layer from a substrate comprising a low-κ dielectric material preserving the characteristics of the low-κ dielectric material includes: a)—providing a substrate comprising a hardened photoresist layer and a low-κ dielectric material at least partially exposed; b)—forming C=C double bonds in the hardened photoresist by exposing the hardened photoresist to UV radiation having a wavelength between 200 nm and 300 nm in vacuum or in an inert atmosphere; c)—breaking the C=C double bonds formed in step b) by reacting the hardened photoresist with ozone ($O_3$) or a mixture of ozone ($O_3$) and oxygen ($O_2$) thereby fragmenting the hardened photoresist; and d)—removing the fragmented photoresist obtained in step c) by wet processing with cleaning chemistries.

20 Claims, 11 Drawing Sheets

METHOD FOR REMOVING A HARDENED PHOTORESIST

RELATED APPLICATIONS

This application claims priority under 35 U.S.C. §119(e) to U.S. Provisional Patent Application Ser. No. 61/098,474, filed on Sep. 19, 2008, the full disclosure of which is incorporated herein by reference.

FIELD

The present disclosure relates to methods to remove a hardened photoresist, such as plasma etched photoresist film or an ion-implanted photoresist film, from a substrate comprising a porous (low-κ) dielectric material, preserving the characteristics of the porous (low-κ) dielectric material.

BACKGROUND

In the Back-End-of-Line (BEOL) processing of semiconductor devices, the remaining photoresist (PR) layer after plasma etch (post-etch photoresist or hardened photoresist) is traditionally removed using an oxygen containing plasma process, also known as ashing. Plasma processes and more particularly oxygen containing plasma process are known to induce damage to porous (low-κ) dielectric materials that are exposed during the photoresist removal, in such an extent that the performance of the semiconductor devices is deteriorated.

To minimize damage to the porous (low-κ) dielectrics, alternative wet chemistry methods mostly based on organic solvents are gaining a renewed interest. However, the presence of a "crust" generated by the etch plasma at the PR surface makes it impossible to completely remove the plasma etched photoresist by a pure organic solvent. The crust, most likely composed of cross-linked polymers, is not soluble in several types of organic solvents.

Porous dielectrics, also known as low-κ dielectrics are dielectric materials having a dielectric constant κ lower than the dielectric constant of silicon dioxide ($\kappa_{SiO2}$=3.9). Specifications on low-κ dielectric material loss and κ-value integrity (preserving the κ-value of the porous dielectric material upon photoresist removal) are difficult to meet by the purely wet-chemistry methods.

A challenge is to remove hardened photoresist without damaging (neither chemically, nor structurally) or etching the exposed low-κ materials. This challenge is particularly difficult to meet in single-wafer (SW) processing, required to remove hardened PR in shorter time intervals (e.g., about 1 min, while batch systems take from 10 min to 30 min). Increasing the concentrations of the chemicals to meet throughput requirements is not a valid solution when low-κ materials are exposed.

Wet strip chemistries (i.e. a mixture of chemical substances (or solution) in the liquid phase, comprising a solvent) are usually based on organic solvents, since hardened PR comprises polymers that are not soluble in water. However, more strict environmental regulations call for a reduction in the Environmental, Safety & Health (ESH) impact of solvents used in manufacturing. Beside ESH aspects, organic solvents usually bring higher costs from components and waste treatment.

SUMMARY

The present disclosure provides a method for removing a hardened photoresist layer from a substrate comprising a low-κ dielectric material preserving the characteristics of the low-κ dielectric material, the method comprising (or, in an example, consisting of):

providing a substrate comprising a hardened photoresist layer and a low-κ dielectric material at least partially exposed;

forming C═C double bonds in the hardened photoresist by exposing the hardened photoresist to UV radiation having a wavelength between 200 nm and 300 nm in at least one of a vacuum or an inert atmosphere;

breaking the C═C double bonds by reacting the hardened photoresist with at least one of ozone ($O_3$) or a mixture of ozone ($O_3$) and oxygen ($O_2$) thereby fragmenting the hardened photoresist; and removing the fragmented photoresist by wet processing with cleaning chemistries.

Preferably, in a method according to the present disclosure, the steps of breaking the formed C═C double bonds and removing the fragmented photoresist are performed substantially simultaneously by wet processing in cleaning chemistries comprising ozone.

In a preferred aspect of the method of the present disclosure where the steps of breaking the formed C═C double bonds and removing the fragmented photoresist are performed substantially simultaneously by wet processing in cleaning chemistries comprising ozone, the duration of the exposure to (or contact time with) cleaning chemistries comprising ozone is preferably less than (about) 10 minutes (600 seconds), more preferably less than (about) 5 minutes (300 seconds), even more preferably less than (about) 2 minutes (120 seconds), yet more preferably less than (about) 1 minute (60 seconds). Preferably also, the duration of the exposure to (or contact time with) cleaning chemistries comprising ozone is comprised between (about) 1 second to (about) 600 seconds, more preferably between (about) 30 seconds to (about) 300 seconds, even more preferably between (about) 30 seconds to (about) 120 seconds, yet more preferably between (about) 60 seconds to (about) 120 seconds, most preferably (about) 120 seconds.

In specific embodiments of the present disclosure, the amount of $O_3$ provided with (or $O_3$ concentration used in) the cleaning chemistries comprising ozone as above-indicated is comprised in the range of (about) 30 ppm to (about) 300 ppm.

Preferably, in a method according to the present disclosure, the UV radiation has a wavelength higher than (about) 260 nm.

Preferably, in a method according to the present disclosure, forming C═C double bonds in the hardened photoresist and breaking the formed C═C double bonds are performed substantially simultaneously by supplying oxygen ($O_2$), or ozone ($O_3$) or a mixture of $O_3$ and $O_2$ (supplied e.g. from an ozone generator), while exposing the hardened photoresist to UV radiation.

Preferably, in a method of the present disclosure, the duration of the UV irradiation (or the UV exposure time) is less than (about) 10 minutes (600 seconds), more preferably less than (about) 5 minutes (300 seconds), even more preferably less than (about) 2 minutes (120 seconds), yet more preferably less than (about) 1 minute (60 seconds). Preferably also, the duration of the UV irradiation is comprised between (about) 1 second to (about) 600 seconds, more preferably between (about) 30 seconds to (about) 300 seconds, even more preferably between (about) 30 seconds to (about) 120 seconds, yet more preferably between (about) 60 seconds to (about) 120 seconds, most preferably (about) 120 seconds.

Preferably, in a method according to the present disclosure, the inert atmosphere comprises $N_2$, a noble gas, or mixtures thereof.

Another aspect of the present disclosure is a method for removing a hardened photoresist layer from a substrate comprising a low-κ dielectric material preserving the characteristics of the low-k dielectric material, the method comprising (or, in an example, consisting of):

provide a substrate comprising a hardened photoresist layer and a low-κ dielectric material at least partially exposed;

pre-treating (or exposing) the hardened photoresist with UV radiation having a wavelength between (about) 200 nm and (about) 300 nm in vacuum or in an inert atmosphere; and removing the pre-treated hardened photoresist by wet processing with cleaning chemistries comprising ozone.

Another aspect of the present disclosure is a method for removing a hardened photoresist layer from a substrate comprising a low-κ dielectric material preserving the characteristics of the low-κ dielectric material, the method comprising:

providing a substrate comprising a hardened photoresist layer and a low-κ dielectric material at least partially exposed;

pre-treating the hardened photoresist with UV radiation having a wavelength between (about) 260 nm and (about) 300 nm in the presence of $O_2$ or ozone ($O_3$) or a mixture of $O_2$ and $O_3$; and removing the pre-treated hardened photoresist by wet processing in cleaning chemistries.

In a method of the invention, ozone can be provided during both the UV irradiation (or UV exposure) step and the wet processing step.

Preferably, in a method according to the present disclosure, the cleaning chemistries consist of aqueous(-based) solutions.

Preferably, the aqueous(-based) solutions include de-ionized (DI) water.

Preferably, in a method according to the present disclosure, the cleaning chemistries include organic solvents or mixtures thereof.

Preferably, the organic solvents are selected from the group consisting of halogenated solvents, propylene carbonate (PC), N-methyl pyrrolidone (NMP), and mixtures thereof. According to one preferred aspect of the method of the present disclosure wherein the organic solvents are halogenated solvents, the organic solvents are preferably fluorinated solvents.

Preferably, in a method of the present disclosure, the temperature of the cleaning step (i.e. wet processing step) using water as cleaning solution ranges from room temperature to (about) 95° C., more preferably, the temperature of said cleaning step is (about) 60° C. Preferably, additional rinsing using an organic solvent (e.g., isopropylalcohol, propylene carbonate) is performed.

Preferably, in a method of the present disclosure, the temperature of the cleaning step (i.e. wet processing step) using organic solvents (possibly in combination with $O_3$) is (about) 5 to 10° C. below the flash point of the organic solvent used.

Preferably, in a method according to the present disclosure, the cleaning chemistries comprise chemical additives such as surfactants, corrosion inhibitors or chelating agents.

Preferably, a method according to the present disclosure comprises performing additional rinsing with de-ionized (DI)-water or organic solvent after removing the fragmented photoresist.

A method according to the present disclosure can be used for the manufacture of an electronic device.

Preferably, in a method according to the present disclosure, the hardened photoresist layer comprises a stack of multiple layers, wherein said multiple layers comprise an antireflective coating layer (ARC), preferably a top antireflective coating (TARC) layer or a bottom antireflective coating (BARC) layer, more preferably a bottom antireflective coating layer.

BRIEF DESCRIPTION OF THE DRAWINGS

Various exemplary embodiments are described herein with reference to the following drawings, wherein like numerals denote like entities. The drawings described are only schematic and are non-limiting.

DETAILED DESCRIPTION OF THE INVENTION

Different embodiments of the present specification disclose methods to remove hardened photoresist from a low-κ material without damaging the exposed low-κ material and having the advantage of a higher throughput while being more environmental friendly than the state-of-the-art.

Single Wafer (SW) processing requires removing hardened PR in shorter time intervals, when compared to the batch system processing. Increasing chemistry concentrations (i.e. increasing the concentrations of the mixture of the chemical substances (or solution) used) to meet throughput requirements is not a valid solution when low-κ materials are exposed/partially exposed during the hardened PR removal. In this respect, short UV pre-treatments before the wet chemistry treatment may enable the use of diluted or less aggressive chemistries (or solutions) for both SW and batch wet strip.

In the context of the present disclosure, "wet chemistry treatment (or processing, or method)" refers to a treatment (or processing, or method) using a mixture of chemical substances (or solution) in the liquid phase.

When compared with organic solvent-based chemistries, the aqueous-based chemistries to remove hardened photoresist are more environmental friendly. However, solubilizing polymers in water requires a higher degree of polymer degradation compared to organic solvents. Using chemistries (or solutions) with higher oxidative power or higher concentrations to meet throughput requirements is not compatible with the fragile porous (low-κ) dielectric materials. In this respect, short UV pre-treatments before the aqueous-based chemistry treatment may enable the use of aqueous chemistries (or aqueous solutions) for both SW and batch wet strip.

In the context of the present disclosure, "organic solvent-based chemistries" refers to (the use of) a mixture of chemical substances (or solution), comprising an organic solvent (or organic solvents).

Figure 12:
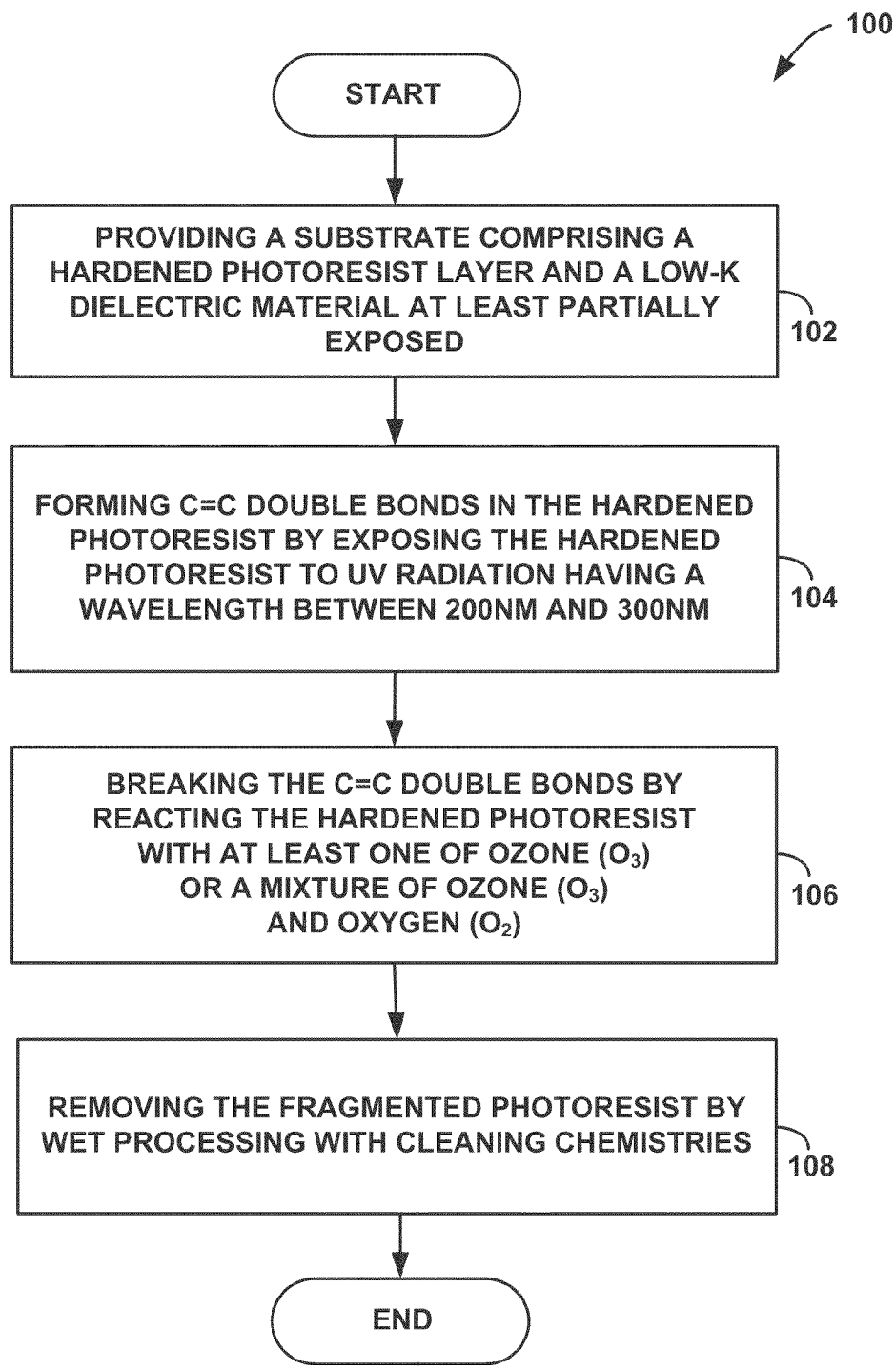
FIG. 12 illustrates a method in accordance with an exemplary embodiment.

In the context of the present disclosure, "aqueous-based chemistry (or chemistries)" refers to (the use of) an aqueous solution (or aqueous solutions). Described herein is a method for removing a hardened photoresist layer from a substrate comprising a low-k dielectric material preserving the characteristics of the low-k dielectric material. For example, an exemplary method 100 is depicted in FIG. 12. The method includes, at step 102, providing a substrate comprising a hardened photoresist layer and a low-κ dielectric material at least partially exposed. Step 104 includes forming C=C double bonds in the hardened photoresist by exposing the hardened photoresist to UV radiation having a wavelength between 200 nm and 300 nm in at least one of a vacuum or an inert atmosphere. The method further includes, at step 106, breaking the C=C double bonds by reacting the hardened photoresist with at least one of ozone ($O_3$) or a mixture of ozone ($O_3$) and oxygen ($O_2$), thereby fragmenting the hardened photoresist. Still further, the method includes, at step 108, removing the fragmented photoresist by wet processing with cleaning chemistries.

In an embodiment, this method may comprise (or consist of):
a)—providing a substrate comprising a hardened photoresist layer and a low-κ dielectric material at least partially exposed,
b)—forming C=C double bonds in the hardened photoresist by exposing the hardened photoresist to UV radiation having a wavelength between (about) 200 nm and (about) 300 nm in vacuum or in an inert atmosphere,
c)—breaking the C=C double bonds formed in step b) by reacting the hardened photoresist with ozone ($O_3$) or a mixture of ozone ($O_3$) and oxygen ($O_2$) thereby fragmenting (or fracturing) the hardened photoresist,
d)—removing the fragmented photoresist obtained in step c) by wet processing with cleaning chemistries.

In the context of the present disclosure, "low-κ dielectric material" refers to dielectric materials having a dielectric constant κ lower than the dielectric constant of silicon dioxide (with $κ_{SiO2}$ being 3.9).

In the context of the present disclosure, "the characteristics of the low-κ dielectric material" refers to, among others, the κ-value, the amount of Si—$CH_3$ groups, and/or the Young's modulus of the porous dielectric material under consideration.

In the context of the present disclosure, "preserving the characteristics of the low-κ dielectric material" refers to preserving the κ-value of the porous dielectric material (i.e. κ-value integrity) upon photoresist removal, more particularly, preserving, among others, the κ-value, the amount of Si—$CH_3$ groups, and/or the Young's modulus of the porous dielectric material under consideration upon photoresist removal (or otherwise said, no loss in low-κ dielectric material, or no chemical or structural damage of the exposed low-κ materials occurs upon photoresist removal).

In the context of the present disclosure, "exposed material" refers to that part of the material (or layers) allowed to be irradiated with UV wavelengths (or otherwise said, that part of material (or layers) not covered with another material (or layer) on top of it).

In the context of the present disclosure, "exposing the hardened photoresist to UV radiation" refers to irradiating the hardened photoresist with UV wavelengths.

In the context of the present disclosure, "cleaning chemistries" refers to the mixture of chemical substances (or solution) used in the cleaning step.

In a method according to the invention, said wet processing comprises a cleaning step.

Preferably, in a method according to the present disclosure, said cleaning step comprises removing the fragmented photoresist using a protic solvent.

Preferably, said cleaning step comprises removing the fragmented photoresist using an aqueous solution, or an organic solvent.

Preferably, said aqueous solution consists of (de-ionized) water.

More particularly, the organic solvent can be selected from a group comprising pyrrolidone (e.g., n-methyl pyrrolidone NMP), carbonates (e.g., propylene carbonate, PC), sulfoxides, acetates, alcohol-amines, organic alcohols and esters, or mixtures thereof.

Preferably, said organic solvent comprises (or consists of) halogenated solvents.

More preferably, said halogenated solvents comprise (or consist of) fluorinated solvents.

Preferably, in a method according to the invention, said wet processing further comprises performing a rinsing step after having performed said cleaning step.

Preferably, the duration of said rinsing step is in the range between (about) 30 seconds and (about) 10 minutes.

Preferably, said rinsing step comprises rinsing the substrate using (de-ionized) water (DIW), or an organic solvent.

More particularly, said organic solvent comprises (or consists of) isopropylalcohol, or propylene carbonate (PC).

Preferably, after said wet processing a drying step is performed.

More particularly, said drying step can be a spin drying or a Marangoni drying performed using $N_2$.

A substrate may be a semiconductor material comprising silicon, silicon on insulator (SOI), silicon-germanium, germanium and/or III-V semiconductor compounds or combinations thereof. In particular embodiments the substrate is a silicon wafer.

Herein below, a pristine photoresist is an as-deposited (as coated) photoresist material, before being subjected to any process of irradiation, plasma etch or ion implantation.

A photoresist layer as referred to in the current application can be a single layer or a stack of multiple layers, including at least one photosensitive layer (the actual photoresist material) and different antireflective coating layers (ARC), such as top antireflective coating (TARC) layers or bottom anti reflective coating (BARC) layers.

In the context of the present disclosure, a "hardened photoresist material (or layer)" refers to a photoresist material (or layer) being subjected to any process of irradiation, more particularly, said hardened photoresist material (or layer) consists of a plasma etched photoresist material (or layer), a plasma modified photoresist material (or layer), or an ion-implanted photoresist material (or layer).

Said hardened photoresist material (or layer) can be used as mask during plasma etch and, respectively, ion implantation processes in front-end-of-line (FEOL) or back-end-of-line (BEOL) applications.

A hardened photoresist may consist of a plasma etched photoresist, a plasma modified photoresist or an ion implanted photoresist used as mask during plasma etch and, respectively, ion implantation processes in semiconductor manufacturing, both front-end-of-line (FEOL) or back-end-of-line (BEOL) applications.

A hardened photoresist layer may comprise a crust at the photoresist surface caused by the etch plasma or by the ion implantation process. Underneath the crust an intermediate region/layer may exist wherein the photoresist properties are only partially modified. Underneath the partially modified photoresist a region/layer of bulk photoresist having still the initial properties may be present. There are no clear boundaries between the different regions/layers in the hardened photoresist. Depending on the pattern density, the initial thickness of the pristine photoresist and the plasma/ion implantation process parameters, the different regions/layers in a hardened photoresist may coexist.

In different embodiments, the hardened photoresist layer is overlying and in contact with the low-κ dielectric material.

In other embodiments, the hardened photoresist layer is overlying and in contact with a metal hard mask (MHM) layer. The MHM layer may comprise at least a metal layer (e.g. TiN, TaN) which is overlying and in contact with the low-κ dielectric material. In these embodiments the low-κ dielectric material is only partially exposed during the removal process.

Without wishing to be bound by theory, it is believed that a mechanism that explains the efficiency of the disclosed method involves forming carbon-carbon double bonds (C═C) in the hardened photoresist by exposing the hardened photoresist to UV radiation having a wavelength between 200 nm and 300 nm, in vacuum or in an inert atmosphere. These double bonds constitute further sites for selective chemical attack by an oxidizer during the UV irradiation or during the subsequently wet processing with cleaning chemistries, as shown schematically by the reaction below:

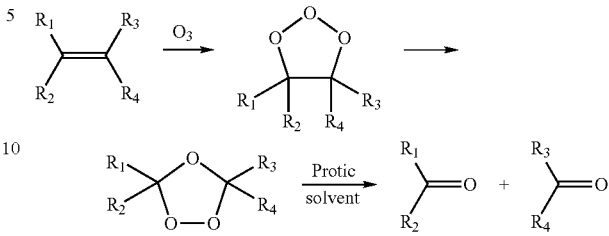

The cleaning chemistries comprise preferably a protic solvent. The cleaning chemistries are either aqueous-based chemistries or organic solvent-based chemistries.

Fracturing the hardened photoresist by attacking the carbon-carbon double bonds (C═C) with an oxidizer (e.g., $O_3$ or mixtures of $O_2$ and $O_3$) allows the solubilization of the hardened photoresist in aqueous-based chemistries or organic solvent-based chemistries widely used in semiconductor manufacturing. Finding suitable aqueous-based chemistries or organic solvent-based chemistries for use herein, is well within the practice of those skilled in the art.

An inert atmosphere can comprise $N_2$ or any inert (or noble) gas (e.g. He, Ar) or mixtures thereof.

An ozone generator typically provides a mixture of ozone (gas) and oxygen (gas).

More particularly, an ozone generator provides ozone (gas), or a mixture of ozone and oxygen gas, starting from oxygen (gas).

In different embodiments of the present disclosure, breaking the formed C═C double bonds and removing the fragmented photoresist are performed substantially simultaneously by wet processing in cleaning chemistries comprising ozone ($O_3$).

In some embodiments of the present disclosure, the UV radiation has a wavelength between (about) 260 nm and (about) 300 nm, which enables the simultaneous exposure of the hardened photoresist to UV and ozone (and/or oxygen), without ozone (and/or oxygen) decomposition.

Consequently, in these embodiments, forming C═C double bonds in the hardened photoresist and breaking the formed C═C double bonds can be performed substantially simultaneously by supplying oxygen, or ozone or a mixture of ozone and oxygen (supplied e.g. from an ozone generator), while exposing the hardened photoresist to UV radiation.

Figure 13:
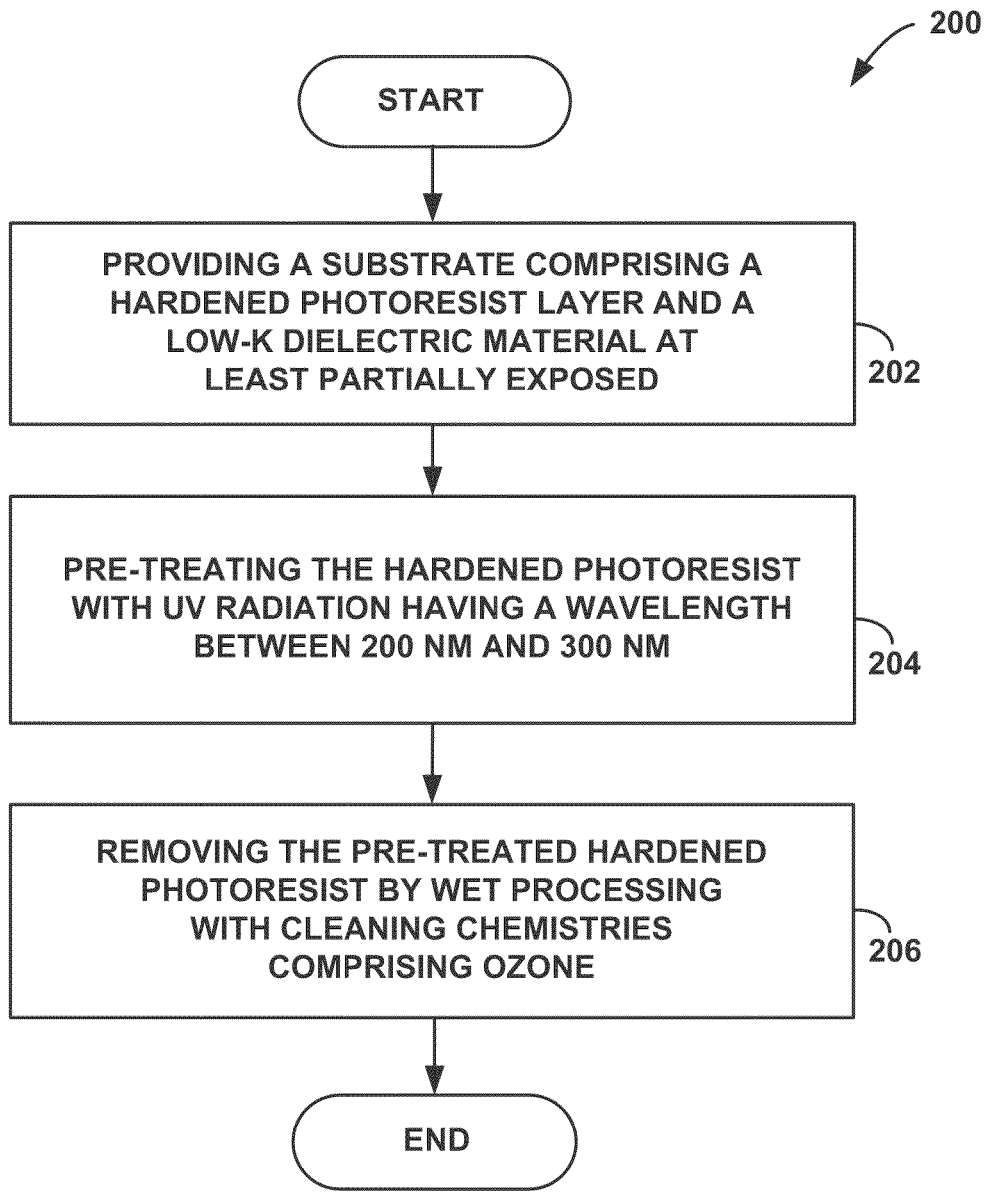
FIG. 13 illustrates a method in accordance with an exemplary embodiment.

In some embodiments, a method for removing a hardened photoresist layer from a substrate comprising a low-κ dielectric material preserving the characteristics of the low-κ dielectric material is disclosed. An exemplary method 200 is depicted in FIG. 13. Method 200 includes, at step 202, providing a substrate comprising a hardened photoresist layer and a low-κ dielectric material at least partially exposed. The method further includes, at step 204, pre-treating the hardened photoresist with UV radiation having a wavelength between 200 nm and 300 nm in at least one of a vacuum or an inert atmosphere. The method still further includes, at step 206, removing the pre-treated hardened photoresist by wet processing with cleaning chemistries comprising ozone.

In an embodiment, this method comprises:
  providing a substrate comprising a hardened photoresist layer and a low-κ dielectric material at least partially exposed;

pre-treating the hardened photoresist with UV radiation having a wavelength between 200 nm and 300 nm in vacuum or in an inert atmosphere; and removing the pre-treated hardened photoresist by wet processing with cleaning chemistries comprising ozone.

In the context of the present disclosure, "pre-treating" the hardened photoresist with UV radiation refers to exposing the hardened photoresist to UV radiation (or irradiating the hardened photoresist with UV wavelengths).

Figure 14:
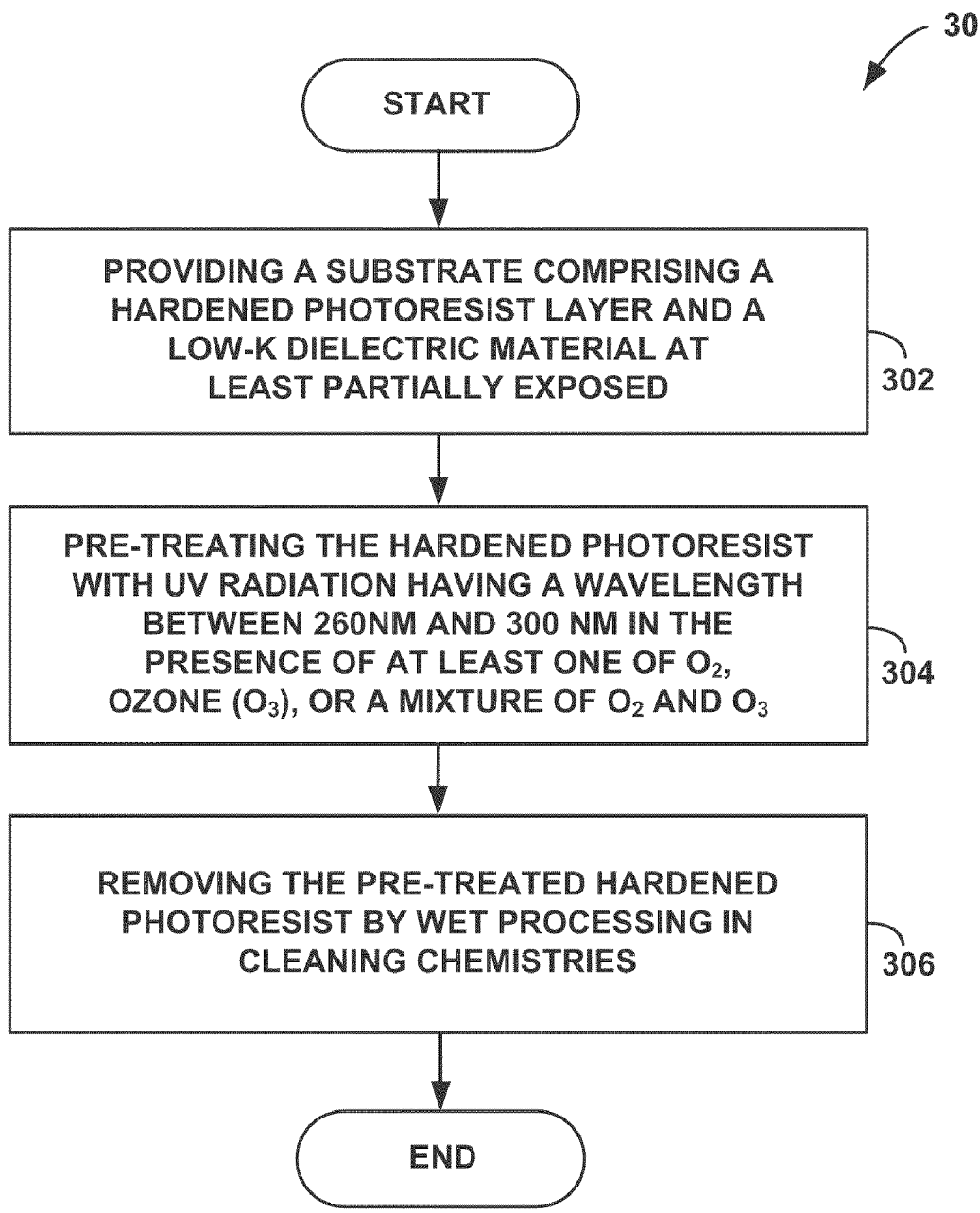
FIG. 14 illustrates a method in accordance with an exemplary embodiment.

In other embodiments, a method for removing a hardened photoresist layer from a substrate comprising a low-κ dielectric material preserving the characteristics of the low-κ dielectric material is disclosed. An exemplary method 300 is depicted in FIG. 14. Method 300 includes, at step 302, providing a substrate comprising a hardened photoresist layer and a low-κ dielectric material at least partially exposed. The method further includes, at step 304, pre-treating the hardened photoresist with UV radiation having a wavelength between 260 nm and 300 nm in the presence of at least one of $O_2$, ozone ($O_3$), or a mixture of $O_2$ and $O_3$. The method still further includes, at step 306, removing the pre-treated hardened photoresist by wet processing in cleaning chemistries.

In an embodiment, this method comprises:

providing a substrate comprising a hardened photoresist layer and a low-κ dielectric material at least partially exposed;

pre-treating the hardened photoresist with UV radiation having a wavelength between 260 nm and 300 nm in the presence of $O_2$, or $O_3$, or mixtures of $O_2$ and $O_3$; and removing the pre-treated hardened photoresist by wet processing in cleaning chemistries.

In different embodiments, the cleaning chemistries comprise (or consist of) aqueous(-based) solutions. The aqueous (-based) solutions are more environmental friendly (when compared to organic solvents used in the art). An additional advantage is that aqueous(-based) solutions can be chosen to remove both the bottom antireflective coating (BARC) underlying the hardened photoresist layer and the hardened photoresist in the same process, shortening in this way the manufacturing process. Moreover, in the embodiments wherein ozone is supplied during the UV pre-treatment the choice of the aqueous(-based) solution is not limited by the compatibility with ozone.

In specific embodiments, the aqueous(-based) solutions consist of de-ionized (DI) water.

In different embodiments, the cleaning chemistries comprise (or consist of) organic solvents or mixtures thereof. The organic solvents are preferably halogenated solvents and, more preferably, fluorinated solvents. Alternatively, the organic solvents can be selected from a group comprising pyrrolidone (e.g., n-methyl pyrrolidone NMP), carbonates (e.g., propylene carbonate, PC), sulfoxides, acetates, alcoholamines, organic alcohols and esters.

In different embodiments, the cleaning chemistries further comprise chemical additives such as surfactants, corrosion inhibitors (such as e.g. acetic acid or glycolic acid), chelating agents or any other additives of common use in the semiconductor manufacturing.

In different embodiments, an UV pre-treatment is applied first to the hardened photoresist. Without wishing to be bound by theory, it is believed that the UV irradiation leads to the formation of carbon-carbon double bonds (C═C) in the backbone of the cross-linked photoresist polymer chains, which are reactive sites for bond breaking by an oxidizer. Subsequently to the formation of the C═C double bonds, an oxidizer (e.g., ozone $O_3$, or a mixture of $O_2$ and $O_3$) supplied in the same process or in a subsequent process breaks (or fragments or fractures) the polymer network into smaller pieces and renders it soluble in a wet chemistry (or solution).

The effect of the UV radiation on the hardened photoresist material depends on the UV wavelength and hence on the UV source. On polymethyl methacrylate (PMMA), the ratio between C—C cleavage and C═C formation increases as the UV wavelength decreases.

According to the method of the invention, the duration of the UV irradiation (or the UV exposure time) depends on the power of the UV lamp used. Finding a suitable combination of power of the UV lamp used and the duration of theUV exposure (or the UV exposure time) for use in a method according to the present invention is well within the practice of those skilled in the art.

Preferably, in a method of the invention, the duration of the UV irradiation (or the UV exposure time) is less than (about) 10 minutes (600 seconds), more preferably less than (about) 5 minutes (300 seconds), even more preferably less than (about) 2 minutes (120 seconds), yet more preferably less than (about) 1 minute (60 seconds). Preferably also, the duration of the UV irradiation is comprised between (about) 1 second to (about) 600 seconds, more preferably between (about) 30 seconds to (about) 300 seconds, even more preferably between (about) 30 seconds to (about) 120 seconds, yet more preferably between (about) 60 seconds to (about) 120 seconds, most preferably (about) 120 seconds.

Without wishing to be bound by theory, it is believed that the UV treatments at shorter wavelengths (e.g., lower than 200 nm and more particularly lower than 193 nm) tend to cause cross-linking of the photoresist. Therefore for generation of C═C bond it is preferable to perform the UV treatment at high wavelengths (e.g., wavelengths between (about) 200 nm and (about) 300 nm). Moreover, the degree of damage (expressed mostly in an increase of the κ-value) of the low-κ dielectrics by UV radiation increases as the wavelength decreases.

In general, a porous material or a low-κ dielectric material readily degrades upon being irradiated by an UV source. The degradation of low-κ dielectrics including, for example, loss of Si—$CH_3$ groups, increase of Young's modulus and increase in κ-value is more pronounced for wavelengths below (about) 200 nm.

In the particular examples disclosed below several UV sources have been used like e.g. UV excimer lamps, broadband UV lamps (e.g., a mercury vapor lamp), noble gas plasmas (e.g., He, Ar). Experimental results obtained indicate that a wavelength within 200-300 nm range does not induce significant (chemical and/or structural) damage on the low-κ materials.

The effect of UV radiation on the hardened photoresist and on the exposed low-κ material depends on the atmosphere the substrates are exposed to. UV radiation can lead to the formation of oxygen radicals and ozone from $O_2$ (e.g., at 185 nm) and dissociate ozone ($O_3$) to form oxygen radicals at 254 nm. These mechanisms may be used in the UV/$O_2$ and, respectively, UV/$O_3$ process to remove organic contamination and photoresist stripping.

In one specific embodiment, the photoresist material to be removed is a hardened 193-nm DUV photoresist, which comprises poly(meth) acrylate polymers (i.e. polyacrylate, polymethacrylate, or acrylate and methacrylate co-polymers). In other embodiments, other photoresist polymer systems can be used as well.

Advantageously, the wavelength of the UV pre-treatment can be adjusted according to the specific photoresist to be removed. The wavelength can be selected upon analyzing the absorption spectra of the photoresist polymer.

In different embodiments, the wavelength of the UV radiation used for the pre-treatment is between 200 nm and 300 nm, in an example preferably between 222 nm and 283 nm (e.g. both wavelengths from excimer lamps, or wavelengths from the single-band low pressure mercury lamp (254 nm)). During the pre-treatment the substrates are kept in vacuum or an inert gas such as $N_2$.

The wet processing according to preferred embodiments can be performed by immersing the substrates in a bath, or by spraying a solution onto the substrate (wafer), or in the controlled boundary layer mode. In the latter case, e.g. spraying is performed in a chamber filled with a gas containing $O_3$, or $O_3$ is bubbled through a recipient containing either water or an organic solvent (said water or organic solvent condensing, and $O_3$ dissolving in said water or organic solvent) that will condense on the substrate.

According to a preferred aspect of the present disclosure where cleaning chemistries not comprising ozone are used to remove the pre-treated (or fragmented) hardened photoresist, the corresponding wet processing is preferably performed by immersing the substrates in a bath, or by spraying the cleaning chemistries onto the substrate.

According to another preferred aspect of the present disclosure where cleaning chemistries comprising ozone are used, the wet processing is preferably performed according to the controlled boundary layer mode. In this way only a thin liquid layer is formed at the substrate surface providing faster $O_3$ transport from the gas phase through the liquid for reaction at the substrate surface.

In the embodiments wherein the cleaning solution is water, a temperature as high as 90° C. can be applied. However, additional rinsing using an organic solvent (e.g., isopropylalcohol, propylene carbonate) may be required.

In the embodiments wherein the ozonated chemistry comprises organic solvents used in combination with $O_3$, the temperature may need to be adjusted depending on the flash point of the organic solvent.

It is well within the capabilities of the person skilled in the art to find a suitable combination of provided amount of $O_3$ (or $O_3$ concentration used) and temperature of the cleaning step (i.e. wet processing step) for use in a method according to the present invention. In general the concentration of dissolved $O_3$ decreases as temperature increases, while reaction kinetics, e.g. breaking the C=C bonds, and dissolving the PR fragments, will be enhanced at higher temperature. It is also known that the concentration of dissolved $O_3$ depends on pH or the concentration of some additives since it is a reactive gas.

In the context of the present disclosure, "ozonated chemistry" refers to the mixture of chemical substances (or solution) used in the cleaning step, comprising ozone.

According to the method of the present disclosure, the duration of the $O_3$ exposure (or the $O_3$ exposure time, or the contact time with $O_3$) depends on the amount of $O_3$ provided (or $O_3$ concentration used) during that exposure step.

In specific embodiments of the present disclosure, the amount of $O_3$ provided (or $O_3$ concentration used) is comprised in the range of (about) 30 ppm to (about) 300 ppm.

Preferably, in a method of the present disclosure, the duration of the $O_3$ exposure (or the $O_3$ exposure time, or the contact time with $O_3$) is less than 2 minutes, more preferably less than 1 minute.

In a preferred aspect of the method of the present disclosure where the steps of breaking the formed C=C double bonds and removing the fragmented photoresist are performed substantially simultaneously by wet processing in cleaning chemistries comprising ozone, the duration of the exposure to (or contact time with) cleaning chemistries comprising ozone is preferably less than (about) 10 minutes (600 seconds), more preferably less than (about) 5 minutes (300 seconds), even more preferably less than (about) 2 minutes (120 seconds), yet more preferably less than (about) 1 minute (60 seconds). Preferably also, the duration of the exposure to (or contact time with) cleaning chemistries comprising ozone is comprised between (about) 1 second to (about) 600 seconds, more preferably between (about) 30 seconds to (about) 300 seconds, even more preferably between (about) 30 seconds to (about) 120 seconds, yet more preferably between (about) 60 seconds to (about) 120 seconds, most preferably (about) 120 seconds.

It is well within the capabilities of the person skilled in the art to find a suitable combination of amount of provided $O_3$ (or $O_3$ concentration) and $O_3$ exposure (or $O_3$ exposure time, or contact time with $O_3$) for use during the cleaning step comprising $O_3$ in a method according to the present invention.

In different embodiments, additional chemicals can be added to the ozonated or non-ozonated chemistries to improve the dissolution of the inorganic residues present on the substrate (e.g., back-sputtered Si from low-κ dielectric or metals from metal hard-masks) or of the bottom anti-reflective coating (BARC). Suitable additional chemicals for use herein will be easily identified by those skilled in the art. Exemplary additional chemistries include, but are not limited to, surfactants, corrosion inhibitors (e.g. organic acids such as e.g. acetic acid, glycolic acid), chelating agents, or any mixtures thereof.

The method described herein discloses selecting the wavelength of the UV lamp such as to avoid degradation of the low-κ dielectric material. The UV lamp wavelength is selected to avoid absorption by $O_2$ and dissociation of $O_3$. Consequently, wavelengths above 260 nm and preferably as close as possible to 300 nm are chosen. At these wavelengths, the atmosphere in the UV tool could contain $O_2$ (e.g., from air or from air leak) since no dissociation of $O_2$ is expected.

The role of water and of the organic solvent is primarily to remove the fragmented photoresist. Additionally, BARC removal or inorganic residues (back-sputtered Si from low-κ dielectric or metals from MHM) removal can be also targeted in the wet cleaning of the method. Advantageously, in the embodiments wherein ozone is not used in the wet processing (but in the UV pre-treatment), the selection of a broader range of cleaning chemistries and additives is possible, not limited by their compatibility with ozone. Suitable cleaning chemistries and additives for use herein may be easily identified by those skilled in the art.

The method described herein may further comprise additional $H_2O$ or organic solvent rinsing after removing the fragmented photoresist.

Preferably, said organic solvent rinsing is performed using isopropylalcohol, or propylene carbonate.

Figure 1:
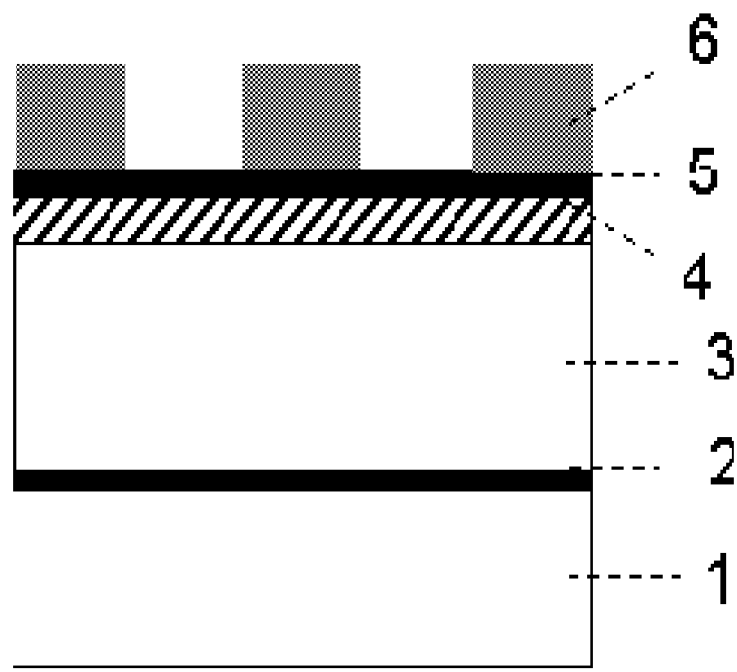
FIG. 1 represents schematically a single damascene stack comprising: a bottom layer of $SiO_2$ (1) overlying a substrate (not shown), 30 nm etch stop layer SiCN/SiCO (2); 180 nm low-κ material, e.g. BD II® (3); 30 nm metal hard mask, TiN (4); 33 nm BARC layer (5); 150 nm photoresist material (6).

In specific embodiments, the low-κ dielectric was SiOCH, more specifically Black Diamond II® (BDII®, κ-value=2.5, porosity about 25%) from Applied Materials. The photoresist was poly(meth)-acrylate-based resin (i.e. based on polyacrylate or polymethacrylate or acrylate/methacrylate copolymers) for 193-nm DUV lithography, with lactone and adamantane as side-chain groups. A photoresist layer of about 150 nm thick was coated onto a blanket Si substrate or on a single damascene structure of BARC/TiN hard mask/low-κ dielectric/bottom hard mask (etch stop layer)/Si stack as shown in FIG. 1. The plasma etch consisted of 3 different steps: (a) 5 mTorr/HBr/60s, (b) 8 mTorr/$Cl_2$/$O_2$/20s, and (c) 5 mTorr/$Cl_2$/HBr/16s, performed in a dual-frequency dielectric etch chamber at room temperature.

In one set of experiments, the UV radiation was generated by a mercury low pressure lamp being a dual wavelength source with a first band at $\lambda_1=184.9$ nm and a second band at $\lambda_2=253.7$ nm. These UV treatments were performed under a nitrogen atmosphere.

In another set of experiments, the UV radiation was generated by a Xe$_2$* excimer lamp ($\lambda=172\pm12$ nm), or by a narrow-band KrCl excimer lamp ($\lambda=222\pm1.2$ nm), or by a XeBr* excimer lamp ($\lambda=283$ nm). These UV treatments were done in vacuum at $10^{-4}$ mbar.

In another set of experiments, the UV radiation was generated by a mercury low pressure lamp emitting only the second band at $\lambda_2=253.7$ nm. These UV treatments were done under an Argon atmosphere.

In a first example, samples (both blanket and patterned) were exposed to UV from the dual-band low pressure mercury lamp for different exposure times, while photoresist removal (on blanket and patterned structures) was carried out in a beaker set-up using pure N-methyl pyrrolidone (NMP) at 60° C. for a contact time of 2 min. After solvent immersion, the samples were rinsed with de-ionized water for 1 min and dried with $N_2$. For blanket photoresist and porous low-κ samples, Fourier-transform infrared spectroscopy (FTIR) and spectroscopic ellipsometry were used to characterize the films before and after modification by UV irradiation and subsequent wet clean. The dielectric constant of blanket low-κ films was determined by Hg-probe. For patterned samples, scanning electron microscopy (SEM) was used for evaluation of cleaning efficiency.

Figure 2:
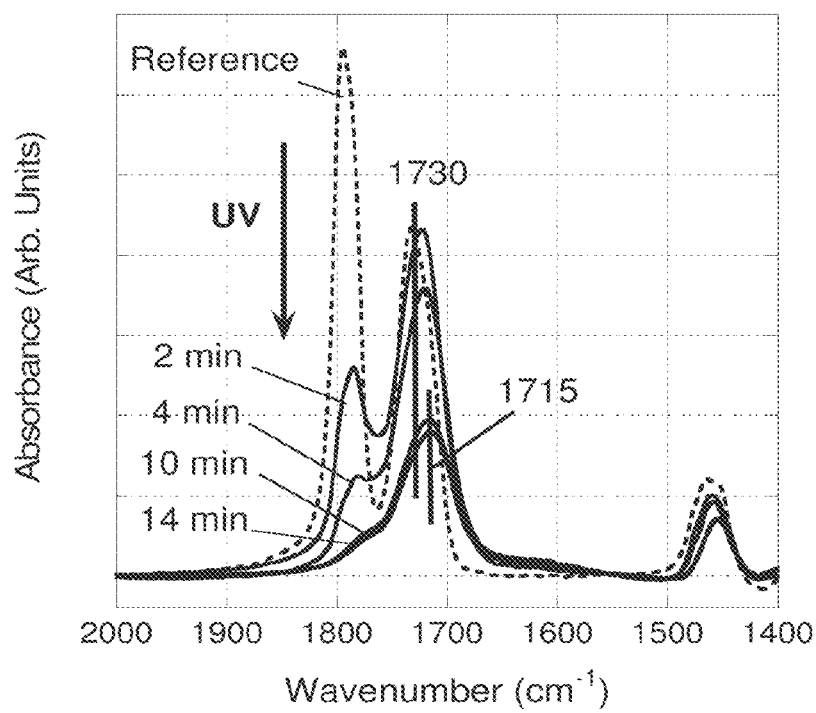
FIG. 2 represents the FTIR spectra of pristine (as-deposited, before any exposure to plasma or ion implantation beam) photoresist film as measured before and after UV irradiation (dual wavelength) under $N_2$ for various exposure times.

In case of pristine photoresist, UV irradiation by photons with wavelength bands at 184.9 and 253.7 nm under $N_2$ led to substantial changes in FTIR spectra. As shown in FIG. 2, the O=C absorption band attributed to the lactone group (wave number ~1795 cm$^{-1}$) and ester (1730 cm$^{-1}$) significantly decreased in intensity as a function of UV treatment time. This effect is similar to that of the etch plasma used to pattern the low-κ film. In addition, the intensity of the absorption band centered at ~1620 cm$^{-1}$ increased upon 2 min of treatment and appeared to remain constant for longer treatment time. In the case of poly methyl methacrylate (PMMA), it has been reported that C=C bonds were generated in the polymer chain as a result of the cleavage of the methyl ester side groups. This cleavage can be accompanied by the scission of C—C bonds in the photoresist polymer chain. The shoulder centered at ~1620 cm$^{-1}$ is assigned to the presence of C=C bonds and the OH from $H_2O$.

Figure 3:
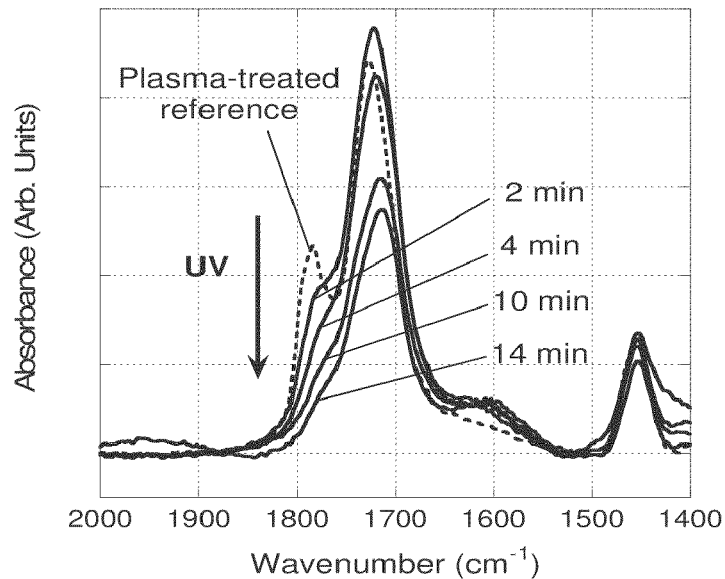
FIG. 3 represents the FTIR spectra of plasma-treated photoresist film as measured before and after UV irradiation (dual wavelength) under $N_2$ for various exposure times.

Similar effect was observed for the plasma-treated (i.e. hardened) photoresist layer. The peak corresponding to lactone group that already drastically decreased after the plasma treatment, further decreased after subsequent UV process as shown in FIG. 3. Surprisingly, the intensity of the C=C absorption band observed in this case is noticeably higher than that from the same UV treatment performed on pristine photoresist.

Figure 4:
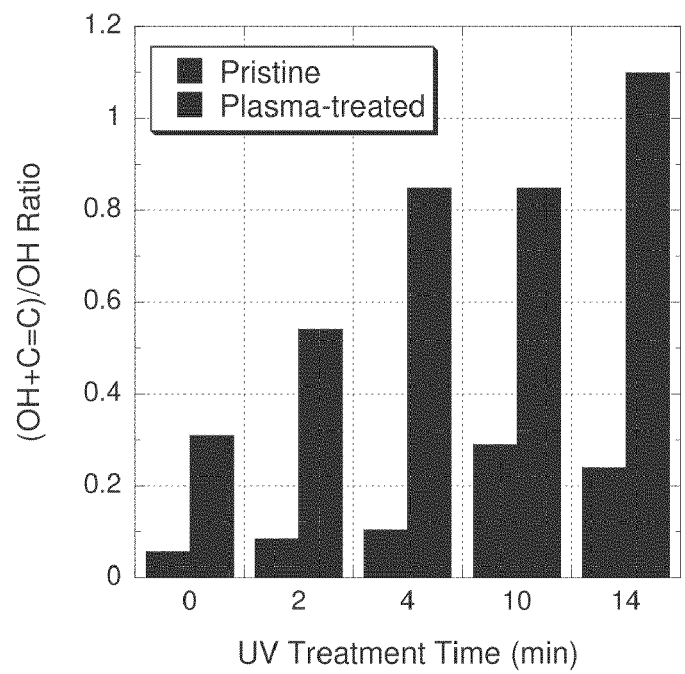
FIG. 4 shows the (OH+C=C)/OH peak ratio measured for photoresist samples after various UV exposure times (dual wavelength) under $N_2$.

FIG. 4 summarizes the formation of C=C bonds that was monitored with FTIR peak area ratio of band at 1600-1650 cm$^{-1}$ (C=C+OH) and band at 3200-3600 cm$^{-1}$ (OH only), i.e. the change in the (OH+C=C)/OH ratio, as a function of the UV treatment time for both pristine and plasma-treated (i.e. hardened) photoresist films. In general, within the range of treatment time studied, the concentration of C=C bonds clearly increases as a function of treatment time.

Figure 5:
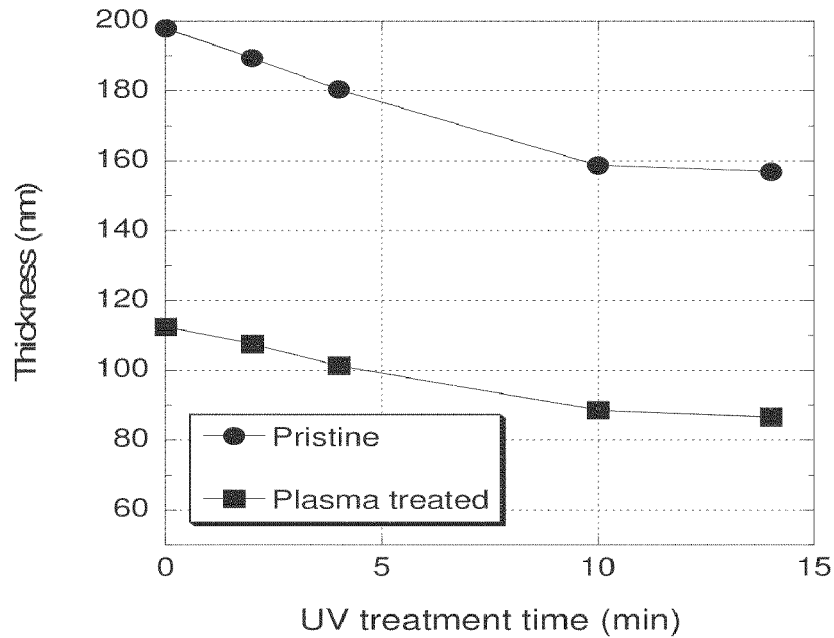
FIG. 5 represents the thickness of pristine and plasma-treated (i.e. hardened) photoresist layer as a function of UV treatment (dual wavelength) under $N_2$.

For both pristine and plasma-treated (i.e. hardened) photoresist, the thickness of the photoresist layer was found to decrease linearly as a function of UV exposure time within the range of 2-10 min, as shown in FIG. 5.

Figure 6:
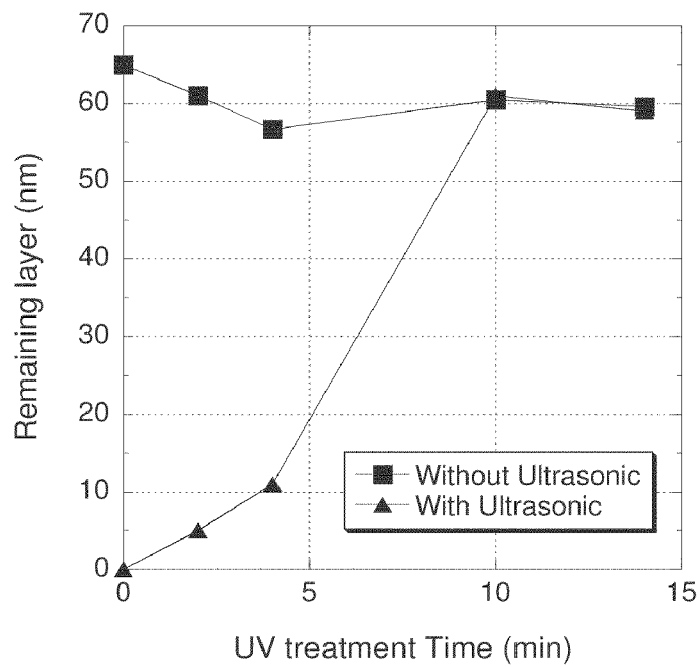
FIG. 6 shows the thickness of plasma-treated photoresist layer measured by ellipsometry after UV exposure (dual wavelength) under $N_2$ and subsequent immersion in NMP at 60° C.

As shown in FIG. 6, the simple immersion of UV-treated hardened photoresist samples in NMP at 60° C. did not result in complete photoresist removal. Regardless of the UV exposure time, the thickness of the photoresist film after 2 min of immersion remained very similar, i.e. ~60 nm. This thickness is believed corresponding to the thickness of the crust induced by the plasma treatment. Stripping of photoresist layer in NMP combined with physical forces (ultrasonic in this case) somewhat improved removal efficiency. However, UV treatment times exceeding 10 min did not seem to enhance the removal efficiency anymore, as shown in FIG. 6. Without wishing to be bound by theory, this negative effect of extended UV exposure on photoresist removal is attributed to cross-linking of photoresist polymer chains.

After irradiation with 172-nm UV light, the FTIR spectra obtained from the plasma-treated (i.e. hardened) photoresist showed similar results as already observed for the dual wavelength source, i.e. significant decrease of the lactone intensity, but with very little change for the peak attributed to C=C and OH group (~1620 cm$^{-1}$, figure not shown).

Figure 7:
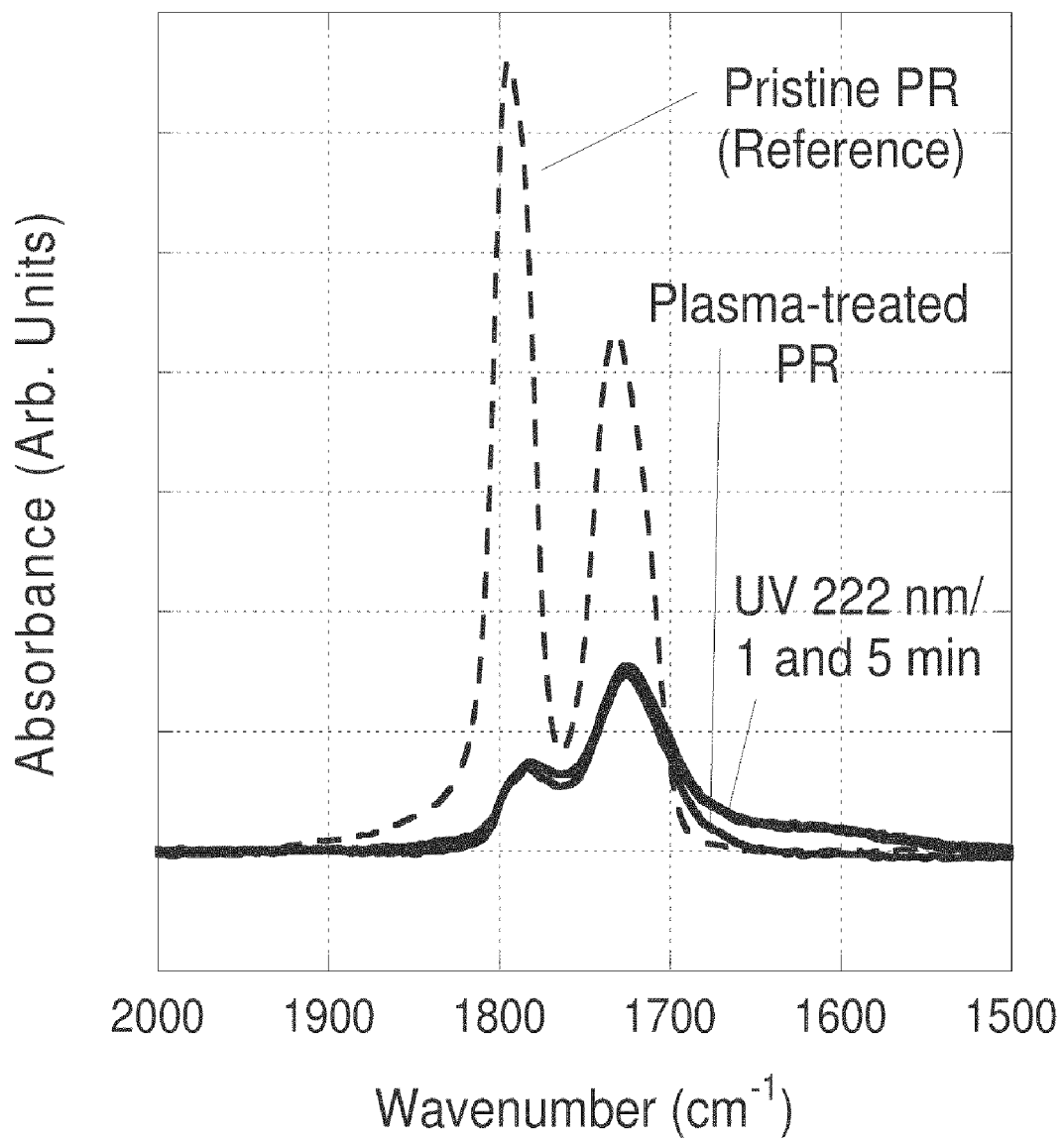
FIG. 7 represents the FTIR spectra of plasma-treated (i.e. hardened) photoresist film as measured after UV irradiation with photons with wavelength at 222 nm under $N_2$ for 1 and 5 min.

On the contrary, irradiation by 222 nm photons showed significant different results compared with the above treatment. The intensity of the lactone group did not decrease further upon UV treatment even for an extended treatment time of 5 min as shown in FIG. 7. In addition, the intensity of the absorption band corresponding to C=C and OH group increased significantly.

Ellipsometry measurements showed that the film thickness decreased only by about 2 nm after 1 min of treatment and remained constant for a 5-min treatment. Clearly, these results indicate that comparing to 172 nm photons, 222 nm photons are more efficient for generation of C=C bonds without affecting the film thickness.

Results from characterization using ellipsometric porosimetry and spectroscopic ellipsometry indicate that SiOCH low-k dielectric (e.g. BDII®) is little affected by UV irradiation by photons with wavelength bands at 184.9 and 253.7 nm. The porosity and thickness of the film remained similar after UV irradiation even for extended time of 10 min. However, evaluation of the k-value using Hg probe showed that the k-value of BDII® increased from 2.55 (pristine) to 3.06±0.05 (after plasma etch for 10 s) and to a value as high as 3.40±0.07 after irradiation by UV for 2 min.

The effect of the UV treatment on the low-k material can vary depending on the atmosphere during the UV treatment and the UV wavelength. The degradation (increase) of the k-value of the porous low-k dielectric is more pronounced for photons with wavelength below 200 nm. At wavelengths above 200 nm, no significant change in κ-value was measured by the mercury probe technique (Δκ<0.1). Also no significant changes were observed in film thickness (by ellipsometry) and in structure or composition (by FTIR).

In a second example, according to an embodiment, samples (both blanket and patterned) were exposed to UV from the low pressure mercury lamp for different times, while photoresist removal was carried out in a beaker set-up using propylene carbonate (PC) with dissolved ozone at 60° C. for different contact times. The experimental matrix for blanket hardened photoresist is summarized in Table 1.

TABLE 1 experimental matrix for the (blanket) hardened photoresist removal tests.

| | | Wet clean | |
|---|---|---|---|
| Sample | UV pre-treatment time (min) | Ozone ($O_3$) conc (ppm) | Solvent (PC) time (min) |
| 0 (Reference) | No | No | No |
| 1 | No | 30 | 1 |
| 2 | No | 30 | 5 |
| 3 | No | 30 | 10 |
| 4 | No | No | 10 |
| 5 | 2 | 30 | 1 |
| 6 | 2 | 30 | 5 |
| 7 | 2 | 30 | 10 |
| 8 | 2 | No | 10 |

The reference sample (0) has been subjected only to plasma etch process. The UV pre-treatment was performed with a dual wavelength source (184.9 nm and 253.7 nm) in $N_2$ atmosphere for 2 min on samples 5-8. The wet processing was performed on all the samples except the reference, with propylene carbonate (PC) at 60° C. for 1, 5 and 10 min respectively, in the presence and in the absence of $O_3$ (30 ppm in 2.0 L/min $O_2$ bubbling through the PC solution).

Figure 8:
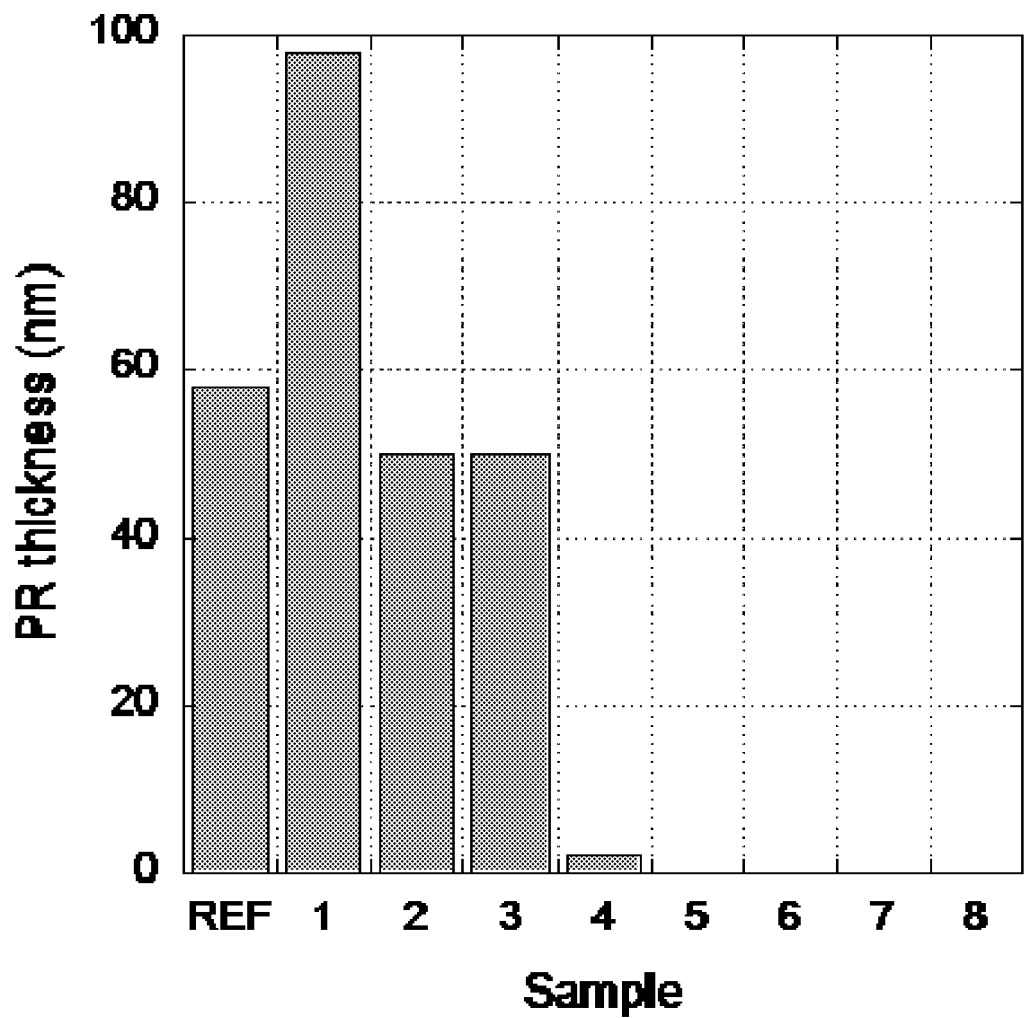
FIG. 8 shows the thickness of the remaining hardened photoresist for the different samples after the photoresist removal tests summarized in Table 1.

The thickness of the photoresist remaining on the substrate after the removal process was measured by ellipsometry. As shown in FIG. 8, incomplete removal is observed for all the samples which have not been pre-treated with UV radiation, except for sample 4 which has been subjected only to PC for 10 minutes. Without wishing to be bound by theory, it is believed that a film delamination (lift-off) process might be responsible for this specific case. It is worthy to mention that wet treatment with solvent alone, even with long contact times, does not work for the patterned samples, as it will be shown further. All the samples pre-treated with UV for 2 min show complete removal of the hardened photoresist. The removal is complete even after 1 min of wet processing with ozonated (30 ppm) propylene carbonate.

In another specific embodiment, different samples containing patterned hardened photoresist (single damascene structure as described elsewhere in the specifications and schematically represented in FIG. 1) were subjected to a photoresist removal process according to an embodiment. The hardened photoresist is a photoresist that has been subjected to plasma etch as described elsewhere in the specifications.

In a specific test, it was shown that $O_3$/organic solvent alone can remove under certain experimental conditions the hardened PR on patterned samples. However, the process temperature for efficient removal was high (90° C.) and the contact time required is not supporting high throughput (10 min, for PC and an ozone concentration of 200 ppm). Under these process conditions, $O_3$ decomposed the propylene carbonate increasing the risk of forming flammable compounds. Moreover, this chemistry (or solution) is not suited for removing BARC layers, which required additional removal.

All the conditions used in tests with $O_3$/organic solvent were shown to be compatible with pristine and plasma exposed low-κ. No significant change in κ-value was measured by the mercury probe technique (Δκ<0.1). Also no significant changes were observed in film thickness (by ellipsometry) and in structure or composition (by FTIR).

A treatment with organic solvent (PC, 10 min) alone, without ozone addition and without UV pre-treatment, does not remove the hardened photoresist.

In another specific test, patterned samples with a single damascene structure have been subjected to an UV pre-treatment followed by either a short wet processing with ozonated propylene carbonate (30 ppm $O_3$, 1 min) or a long wet processing with only propylene carbonate (10 min). The UV pre-treatment was performed with a dual wavelength source (184.9 nm and 253.7 nm) in $N_2$ atmosphere for 2 min. In both cases, the hardened photoresist on the top of the patterned structures was removed, while residues remained in the trenches.

In yet another specific test patterned samples with a single damascene structure have been subjected to an UV pre-treatment followed by wet processing with ozonated (30 ppm $O_3$) propylene carbonate for 5 min and, respectively 10 min. The UV pre-treatment was performed with a dual wavelength source (184.9 nm and 253.7 nm) in $N_2$ atmosphere for 2 min. In both cases, the hardened photoresist was completely removed both from the top of the patterned structures and the trenches. By pre-treating the samples with UV it was possible to completely remove the patterned PR under mild $O_3$ conditions (30 ppm $O_3$ in $O_2$, 60° C.), as compared to the process without UV pre-treatment (200 ppm $O_3$ in $O_2$, 90° C.).

Figure 9:
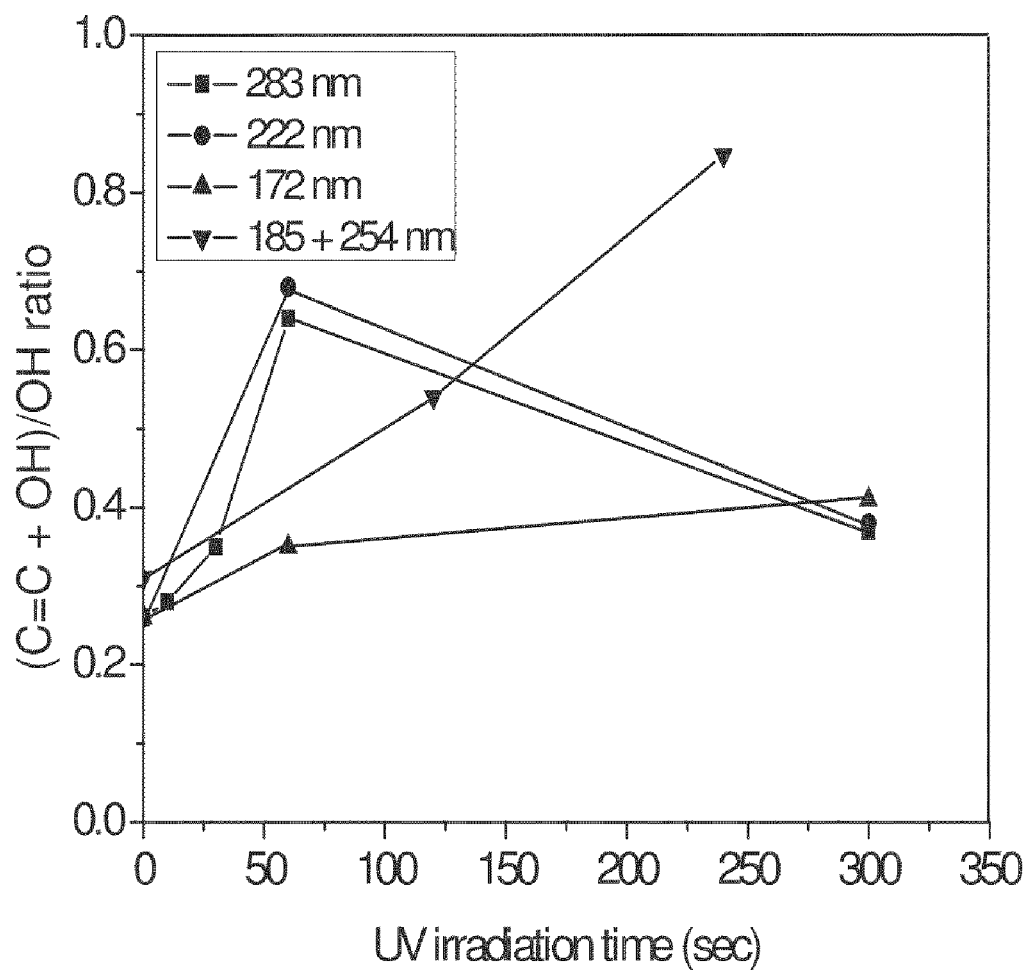
FIG. 9 shows the (C=C+OH)/OH FTIR peak area ratio measured for plasma-treated photoresist samples after various UV exposure times.

FIG. 9 summarizes the change in the (OH+C=C)/OH ratio as a function of the UV treatment time for plasma-treated (i.e. hardened) photoresist films. In comparison to 172 nm, the PR film irradiated by 222 and 283 nm dual wavelength are more efficient in the generation of C=C bonds. For 60 sec UV irradiations, the highest concentration of C=C bonds was reached for 222 nm and 283 nm. Upon UV irradiation times >60 sec a continued increase in C=C bond formation was observed for the dual wavelength UV lamp and at a decreased formation rate for 172 nm, while a decrease is observed for λ=222 and 283 nm.

In a third example, samples (both blanket and patterned) were exposed to UV from the single-band low pressure mercury lamp ($\lambda_2$=253.7 nm) for different times under Ar, while photoresist removal was carried out using $O_3/H_2O$ in an immersion mode. Samples were immersed in water at 60° C. for 1 or 2 min with $O_2/O_3$ bubbling through the water. The ozonated DI water process was done in a home-built lab scale reactor consisting of a thermostated vessel and a diffuser connected to a generator with an $O_2$-flow of 2.0 L/min and 30 or 200 ppm $O_3$ in gas supply. Samples were rinsed either in water or in PC for 1 min at 60° C. before a water rinse at RT.

Figure 10:
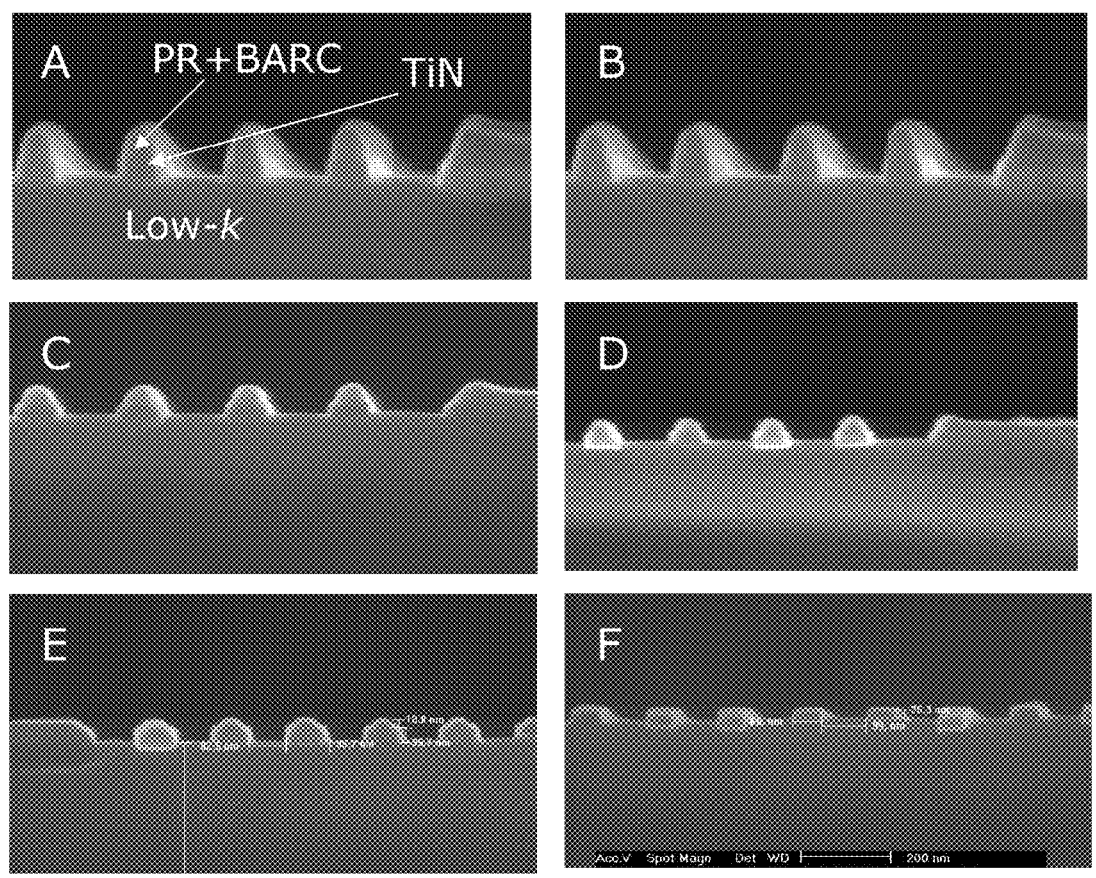
FIG. 10 shows SEM pictures of a patterned (etched) TiN metal hard mask on top of a low-κ dielectric (κ=2.5) (single damascene structure) after different strip processes: (A) reference after etch, (B) after 2 min UV at 254 nm, (C) after 1 min propylene carbonate (PC) rinse and a DIW rinse, (D) after 2 min UV at 254 nm followed by a 1 min propylene carbonate (PC) rinse and a DIW rinse, (E) after 2 min $O_3/H_2O$ strip followed by a 1 min propylene carbonate (PC) rinse and a DIW rinse, (F) after 2 min UV at 254 nm, followed by 2 min $O_3/H_2O$ strip, followed by a 1 min propylene carbonate (PC) rinse and a DIW rinse.

FIG. 10 shows a patterned (or etched) TiN metal hard mask (MHM) on top of a low-κ dielectric (κ=2.5) (single damascene structure) after different strip processes. Picture (A) of FIG. 10 shows the structure after plasma etch, with patterned TiN MHM covered by BARC and photoresist. Pictures (B) and (C) of FIG. 10 show the same structure after 2 min UV exposure and 1 min PC rinse, respectively. No significant removal resulted from the UV exposure alone and only partial removal resulted from the rinse alone. Little improvement in removal resulted from combining UV irradiation and solvent rinse (Picture D). Picture (E) of FIG. 10 shows the same structure after 2 min $O_3/H_2O$ strip at 60° C. and a 1 min propylene carbonate (PC) rinse followed by a DIW rinse. The $O_3/H_2O$ process was performed in immersion mode, as described in previous paragraph. With this process sequence also no complete PR/BARC removal was achieved. Finally Picture (F) of FIG. 10 shows the same structure after 2 min UV exposure, followed by 2 min $O_3/H_2O$ strip at 60° C. and a 1 min propylene carbonate (PC) rinse followed by a DIW rinse. Only with this process sequence combining UV exposure and $O_3/H_2O$ strip a complete PR/BARC removal was achieved.

Figure 11:
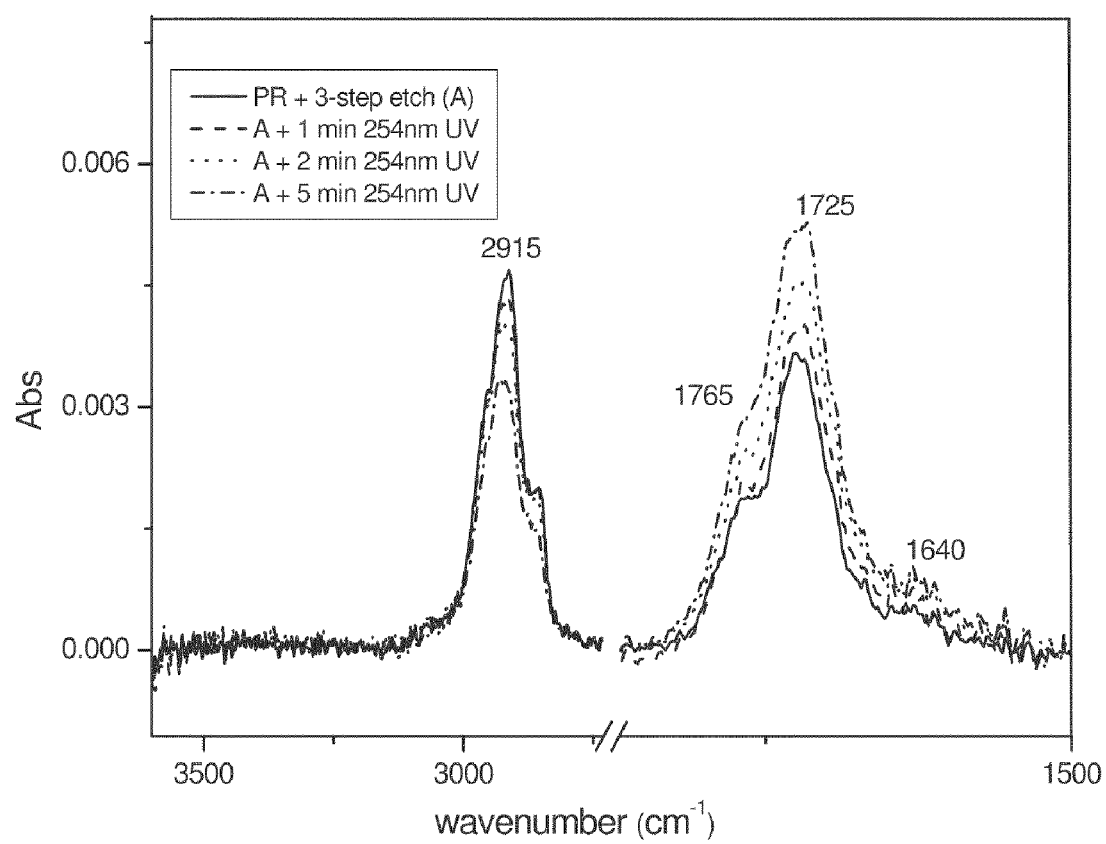
FIG. 11 shows FTIR spectra of plasma-treated photoresist film as measured before and after 254 nm UV irradiation.

UV irradiation by photons with wavelength band centered at 254 nm led to substantial changes in FTIR spectra of blanket plasma-treated photoresist films as shown in FIG. 11. The C=O absorption bands attributed to the lactone group (1765 cm$^{-1}$) and ester function (1725 cm$^{-1}$) increased in intensity as function of UV time. This was very different compared to other wavelengths (222 and 283 nm). The band attributed to alkane signals (2915 cm$^{-1}$) decreased in intensity as function of UV time. The intensity of the absorption band present at 1640 cm$^{-1}$, attributed to C=C and —OH bonds, did slightly increase upon UV treatment time, while the absorption band attributed to —OH (3100-3600 cm$^{-1}$) remained unchanged, indicating the formation of C=C bonds.

No significant change in κ-value was measured by the mercury probe technique (Δκ≦0.1) for all process sequences tested consisting in UV irradiation at 254 nm (for 2 and 5 min), followed by 2 min O$_3$/H$_2$O strip at 60° C. (with 30 ppm and 200 ppm O$_3$ in the O$_2$ gas supply), followed by a 1 min PC rinse at 60° C. Compared to examples 1 and 2 using the dual band mercury lamp (with λ$_1$=185 nm and λ$_2$=254 nm), these tests show compatibility of the UV with the low-κ dielectric since the high energy band at 185 nm has been filtered out from the lamp emission spectrum.

In a fourth example, patterned samples were exposed to UV from the single-band low pressure mercury lamp (λ$_2$=254 nm) for different times under Ar, while photoresist removal was carried out using O$_3$/fluorinated solvent (methoxy-nonafluorobutane, HFE 7100DL® from 3M) in an immersion mode. Samples were immersed in HFE at room temperature (about 20° C.) for 2 or 5 min with O$_2$/O$_3$ bubbling through the solvent. The ozonated HFE process was performed in a home-built lab scale reactor consisting of a thermostated vessel and a diffuser connected to a generator with an O$_2$-flow of 2.0 L/min and 30 or 200 ppm O$_3$ in gas supply. Samples were rinsed either in water or in PC for 1 min at 60° C. before a water rinse at RT.

Similarly to previous example, PR removal efficiency was assessed by scanning electron microscopy (SEM). Only partial PR removal was obtained in conditions using only a water rinse (about 30% decrease in PR thickness). Nearly complete PR removal was obtained in following conditions using a PC rinse: 2 min UV step followed by a 2 min O$_3$/HFE at 30 ppm or 200 ppm O$_3$ or 2 min UV step followed by a 5 min O$_3$/HFE at 200 ppm O$_3$ or 5 min UV step followed by a 2 min O$_3$/HFE at 30 ppm O$_3$ (some residues still left on top of and in-between TiN MHM patterns). Complete PR removal was achieved in following process sequence using a PC rinse: 5 min UV step followed by a 2 or 5 min O$_3$/HFE at 200 ppm O$_3$ or in all conditions using a 10 min UV step. In most conditions there was no significant improvement from using the highest O$_3$ concentration or extending the O$_3$/HFE step time from 2 to 5 min, indicating that the lowest O$_3$ exposure conditions were sufficient to efficiently break bonds in the PR crust.

No significant change in κ-value was measured by the mercury probe technique (Δκ≦0.1) for all process sequences tested consisting in UV irradiation at 254 nm (for 2 and 5 min), followed by 2 min O$_3$/HFE strip at room temperature (with 30 ppm and 200 ppm O$_3$ in the O$_2$ gas supply), followed by a 1 min PC rinse at 60° C.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for removing a hardened photoresist layer from a substrate comprising a low-κ dielectric material, the method comprising:
    subjecting a substrate comprising a photoresist layer and a low-κ dielectric material to at least one of an etching step and an ion implantation step, wherein the at least one of the etching step and the ion implantation step forms a hardened photoresist layer, wherein the hardened photoresist layer comprises at least one of a plasma etched photoresist, a plasma modified photoresist, and an ion implanted photoresist;
    subsequent to the at least one of the etching step and the ion implantation step, forming C=C double bonds in the hardened photoresist by exposing the hardened photoresist to UV radiation having a wavelength between 200 nm and 300 nm, wherein, during forming the C=C double bonds, the substrate is in at least one of a vacuum or an inert atmosphere;
    subsequent to forming the C=C double bonds, breaking the C=C double bonds by reacting the hardened photoresist with at least one of ozone (O$_3$) or a mixture of ozone (O$_3$) and oxygen (O$_2$) thereby fragmenting the hardened photoresist; and
    removing the fragmented photoresist by wet processing with cleaning chemistries.

2. The method of claim 1, wherein breaking the formed C=C double bonds and removing the fragmented photoresist are performed substantially simultaneously by wet processing in cleaning chemistries comprising ozone.

3. The method of claim 1, wherein the UV radiation has a wavelength higher than 260 nm.

4. The method of claim 1, wherein the inert atmosphere comprises at least one of N$_2$, a noble gas, or mixtures thereof.

5. The method of claim 1, wherein the cleaning chemistries comprise aqueous solutions.

6. The method of claim 1, wherein the cleaning chemistries comprise organic solvents or mixtures thereof.

7. The method of claim 1, wherein the cleaning chemistries further comprise chemical additives such as surfactants, corrosion inhibitors or chelating agents.

8. The method of claim 1, further comprising performing additional rinsing with at least one of de-ionized (DI)-water or organic solvent after removing the fragmented photoresist.

9. The method according to claim 1, wherein the hardened photoresist layer comprises a stack of multiple layers.

10. The method of claim 1, wherein a degradation of a κ-value of the low-κ dielectric is less than 0.1.

11. The method of claim 5, wherein the aqueous solutions comprise de-ionized (DI) water.

12. The method of claim 6, wherein the organic solvents are selected from the group consisting of halogenated solvents, propylene carbonate (PC), and mixtures thereof.

13. The method of claim 9, wherein said multiple layers comprise an antireflective coating layer (ARC).

14. The method of claim 9, wherein said multiple layers comprise a top antireflective coating (TARC) layer.

15. The method of claim 9, wherein said multiple layers comprise a bottom antireflective coating (BARC) layer.

16. The method of claim 9, wherein said multiple layers comprise a top antireflective coating (TARC) layer and a bottom antireflective coating (BARC) layer.

17. A method for removing a hardened photoresist layer from a substrate comprising a low-κ dielectric material, the method comprising:
    subjecting a substrate comprising a photoresist layer and a low-κ dielectric material to at least one of an etching step and an ion implantation step, wherein the at least one of the etching step and the ion implantation step forms a hardened photoresist layer, wherein the hardened photoresist layer comprises at least one of a plasma etched photoresist, a plasma modified photoresist, and an ion implanted photoresist;

subsequent to the at least one of the etching step and the ion implantation step, pre-treating the hardened photoresist with UV radiation having a wavelength between 200 nm and 300 nm, wherein, during pre-treating the hardened photoresist, the substrate is in at least one of a vacuum or an inert atmosphere; and subsequent to pre-treating the hardened photoresist, removing the pre-treated hardened photoresist by wet processing with cleaning chemistries comprising ozone.

18. The method of claim 17, wherein a degradation of a κ-value of the low-κ dielectric is less than 0.1.

19. A method for removing a hardened photoresist layer from a substrate comprising a low-κ dielectric material, the method comprising:

subjecting a substrate comprising a photoresist layer and a low-κ dielectric material to at least one of an etching step and an ion implantation step, wherein the at least one of the etching step and the ion implantation step forms a hardened photoresist layer, wherein the hardened photoresist layer comprises at least one of a plasma etched photoresist, a plasma modified photoresist, and an ion implanted photoresist;

subsequent to the at least one of the etching step and the ion implantation step, pre-treating the hardened photoresist with UV radiation having a wavelength between 260 nm and 300 nm in the presence of at least one of $O_2$, ozone ($O_3$), or a mixture of $O_2$ and $O_3$; and removing the pre-treated hardened photoresist by wet processing in cleaning chemistries.

20. The method of claim 19, wherein a degradation of a κ-value of the low-κ dielectric is less than 0.1.

* * * * *